United States Patent [19]

Shiraishi et al.

[11] Patent Number: 6,132,908
[45] Date of Patent: Oct. 17, 2000

[54] PHOTO MASK AND EXPOSURE METHOD USING THE SAME

[75] Inventors: Naomasa Shiraishi; Nobutaka Magome, both of Kanagawa; Shigeru Hirukawa, Chiba, all of Japan

[73] Assignee: Nikon Corporation, Tokyo, Japan

[21] Appl. No.: 08/978,014

[22] Filed: Nov. 25, 1997

Related U.S. Application Data

[63] Continuation of application No. 08/692,543, Aug. 5, 1996, abandoned, which is a continuation of application No. 08/513,312, Aug. 10, 1995, abandoned, which is a continuation of application No. 08/334,696, Nov. 4, 1994, abandoned, which is a continuation of application No. 08/108,187, Aug. 17, 1993, abandoned, which is a continuation of application No. 07/780,249, Oct. 22, 1991, abandoned.

[30] Foreign Application Priority Data

Oct. 26, 1990 [JP] Japan ..................... 2-287289
Dec. 26, 1990 [JP] Japan ..................... 2-406811

[51] Int. Cl.$^7$ .................................................. G03F 9/00
[52] U.S. Cl. ........................................................... 430/5
[58] Field of Search .............................. 430/322, 323, 430/30

[56] References Cited

U.S. PATENT DOCUMENTS

| | | | |
|---|---|---|---|
| 4,415,262 | 11/1983 | Koyama et al. ................. | 430/5 |
| 4,530,891 | 7/1985 | Nagarekawa et al. ............ | 430/5 |
| 4,738,886 | 4/1988 | Uchida .......................... | 430/5 |
| 4,890,309 | 12/1989 | Smith et al. .................... | 378/35 |
| 5,045,417 | 9/1991 | Okamoto ........................ | 430/5 |
| 5,290,647 | 10/1990 | Miyazaki et al. ................ | 430/5 |

FOREIGN PATENT DOCUMENTS 3-144453  6/1991  Japan .

*Primary Examiner*—S. Rosasco

[57] ABSTRACT

A photo mask for a lithography process enables the formation of high contrast image and facilitates manufacturing. The photo mask includes a transparent portion for an illumination light and a half-transparent part having a predetermined transmittance for the illumination light. These transparent and half-transparent portions are so constructed that a phase of a transmitted light beam from the half-transparent portion has a phase difference of $2n\pi$ or $(2n+1)\pi$ radian relative to a light beam passed through a transparent portion. Another type of photo mask includes transparent portion for the illumination light and a light shielding portion against the illumination light. At least a part of the shielding portion has a multilayer construction. An edge at least portion of the shielding portion has a different transmittance for the illumination light then a central portion surrounded by the edge portion.

33 Claims, 9 Drawing Sheets

PHOTO MASK AND EXPOSURE METHOD USING THE SAME

This application is a continuation, of application Ser. No. 08/692,543, filed Aug. 5, 1996, abandoned, which is a continuation, of application Ser. No. 08/513,312, filed Aug. 10, 1995 now abandoned, which is a continuation, of application Ser. No. 08/108,187, filed Aug. 17, 1993 abandoned which is a continuation, of application Ser. No. 780,249, filed Oct. 22, 1991, abandoned.

BACKGROUND OF THE INVENTION

1. Field of the Invention

The present invention relates to a photo mask for use in an exposure process and used for manufacturing semiconductor devices and also relates to a method for manufacturing the same.

2. Description of the Prior Art

A conventional photo mask used for photo-lithography processes, a part of the manufacturing process of semiconductor devices, is so constructed that it is made by forming a certain pattern layer of a thin film layer (a light shielding member) of a metal such as chromium on a glass substrate made of a material such as silica having high tranmittances for an illuminating light of an exposure wavelength. This metal thin film layer is formed on a surface of the substrate by sputtering or evaporation coating, with the thickness enough to almost completely shut off the illuminating light. Further, after a resist layer is laminated, a desired circuit pattern is transferred by a contact or proximity exposure of a master mask or by using a direct-write process, and then an undesired portion of the pattern is removed by a process such as etching, etc. thereby obtaining a finished product.

That is, in the conventional photo mask, the circuit pattern is constructed with a transparent portion having the transmittance of 90% or more and the light shielding portion of almost 0% transmittance.

A photo mask is disclosed for enhancing the contrast of a projected image Japanese Patent laid-open No. 62-50811, for example, discloses a so-called phase-shifting mask in which dielectric thin films, called phase shifters, are deposited on a specified part of the transparent portions to give a phase difference about $\pi$ radian between light beams passed through the transparent portions adjoining each other. In this phase-shifting mask, the phase of a transmitted light is controlled by the phase shifter, and the phases of the transmited light beams passing through adjoining transparent portions are opposed to each other to enhance the contrast of the image.

However, in the conventional phase-shifting mask, it is necessary to form the phase-shifters selectively at specified positions of the transparent portions after the usual mask processes have been used, with the result that the manufacturing process becomes complex thereby causing defects and thus result in a high cost.

Moreover, in the conventional photo mask, if the pattern formed on the photo mask is coarse in comparison with the resolution of a projecting lens of an exposure apparatus, the distribution of light intensity of the image formed by a projecting lens has a slight increase of intensity near the center of each dark portion (corresponding to the light shielding portion of the photo mask) of the pattern image. Therefore, if the positive resist is used for an object to be projected, the resist on the dark central portion of the pattern image is also exposed, especially when a large exposure amount is applied, and thus, a concave pattern might be formed on the central portion after the resist is developed.

In addition, as for a mask shown in FIG. 16 in which phase shifters 210 are deposited on specified portions of the pattern formed with a light shielding layer 208 on a mask substrate 201, it is often required to control the intensity of each transmission light passing through a portion attached with the phase shifter 210 and another portion without the phase shifter respectively. Especially, in phase-shifting masks of the edge enhancement type (having an auxiliary pattern) and light shielding effect enhancement type, the line width of the opening (a portion deposited with the phase shifter 210) in the light shielding layer 208 should be narrow, as shown in FIG. 17, in order to limit an amount of transmittion light passing through the opening of the light shielding layer 208. However, if the line width of the opening of the shielding layer 208 is too narrow, the opening will not have a predetermined line width or certain separation at the mask process, and therefore it is difficult to obtain a mask suitable for use.

SUMMARY OF THE INVENTION

The present invention has been made in view of the above described circumstances and it is a primary object of the present invention to provide a photo mask and an exposure method using the same for enhancing the contrast of a pattern image.

Another object of the invention is to provide a method for easy manufacture of a photo mask and for forming a pattern image of high contrast.

In accordance with one aspect of the present invention, there is provided a photo mask for transferring a predetermined pattern to a photosensitive substrate by using an illuminating light, comprising a transparent portion having a transparence for the illuminating light and a half-transparent portion having a predetermined transmittance for the illuminating light, said transparent portion and said half-transparent portion having a material and/or thickness so determined as to produce a phase difference of 2 n$\pi$ or (2 n+1)$\pi$ radian (n denotes an integer) between the phases of light beams passing through said transparent portion and said half-transparent portion.

In order to enhance the contrast of the pattern image according to the present invention, the mask pattern is constructed with the half-transparent portion having a predetermined transmittance for an illuminated light instead of the light shielding portion, and the pattern image is formed by using an interference effect between transmitted lights respectively passing through the transparent portion and the half-transparent portion.

In this case, determining the transmittance of the half-transparent portion within the range from 1 to 15%, as to the positive resist, the resist pattern (convex portion) is prevented from decreasing in its film thickness during the developing, and as to the negative resist, the resist layer is prevented from remaining at the positions corresponding to the half-transparent portion after the developing. The above described transmittance is selected so as (1) not to decrease the film thickness for the positive resist, and (2) not to remain with the resist layer for the negative resist, and (3), based on the exposure light intensity on the mask, the optical characteristics (aberrations) of the projection optical system. Therefore, the transmittance of the half-transparent portion is not limited to the range from 1 to 15%; and, if the film thickness decrease has not occured, the transmittance may be selected to be more than 15% under the specified exposure conditions.

Moreover, if the half-transparent portion is constructed with multilayer films stacked with at least two kinds of thin films such as a metal thin film and a dielectric film, a desired transmittance value may be obtained by optimizing each condition (film thickness) of the dielectric and metal thin films. And, in a similar way, it is possible to provide the transmitted light passed through the half-transparent portion with a desired phase difference ($2n\pi$ or $(2n+1)\pi$) to the transmitted light passed through the transparent portion. Further, if the half-transparent portion is constructed with multilayer films, only making each film thickness optimum may provide easy control of the tranmittance and phase difference. In this case, if an antireflection film is deposited outside the metal thin film which constructs the transparent portion, the reflectivity of the metal thin film pattern on the photo mask is decreased, and multilayer reflection between a wafer and the photo mask is prevented, thereby advantageously enhancing the contrast of the image.

The above described metal thin film and dielectric film can be deposited in layers on a mask substrate and then processed to form a pattern in a time. Thus, the manufacturing process is substantially the same as that of conventional photo masks comprising of transparent portions and light shielding portions, is not as complex as that of the conventional phase-shifting masks.

And, if the half-transparent portion is constructed with a light absorbing dielectric film and the absorbance (namely the type) and thickness of the dielectric film is optimized, any desired transmittance and phase difference can be obtained simultaneously without using any multilayer films. In addition to this, the process for the patterning is completed in a time thereby simplifying the manufacturing process. Further, the light absorbing dielectric film may be used as a single layer described above, and it may also be used as multilayers depending on the tranmittancce and phase difference. In addition, the dielectric film may be used instead of the aforesaid metal thin film.

In accordance with another embodiment of the present invention, there is provided a photo mask comprising a transparent portion of geometrical plane shape having a transmittance for an illuminating light and a light shielding portion of geometrical plane shape having a shield characteristic for the illuminating light, said light shielding portion being provided with at least partly a multilayer construction in which an edge portion of the light shielding portion and a central portion surrounded by the edge portion are constructed as an individual portion each having a different transmittance for the illuminating light.

Generally, the circuit pattern (constructed with a ligth shielding layer for the illuminating light) of the photo mask for manufacturing semiconductor devices is divided into a portion (central portion of the circuit pattern) which gives no influence on an imaging condition (contrast of the image of the circuit pattern) and a portion (edge portion of the circuit pattern) which is adjacent to the transparent portion and influences the imaging condition. In order to enhance the imaging condition (contrast) of the circuit pattern, it is desirable for the edge portion of the circuit pattern to have a certain transmittance (determined by the light absorbance and film thickness) so as to decrease the light intensity which may occur on the dark portion of the pattern image.

In the present invention, in view of the above described principle, at least a part of the light shielding portion which forms the circuit pattern is formed of a multilayer construction, and thus the edge portion of the light shielding portion has a different light transmittance than that of the central portion. In this case, in order to obtain a certain transmittance for the edge portion of the light shielding portion, it may be considered to adjust the film thickness of the edge portion of the light shielding portion (shielding layer) so as to have a certain thickness thinner than that of the central portion by means of the etching process or the like. In order to obtain a certain film thickness accurately by etching a single film material, however, it is necessary to detect the film thicness by, for example, an optical thickness measuring instrument during a period of etching process, thereby making it difficult to obtain a desired film thickness.

In one definite embodiment of a light shielding portion of a photo mask according to the present invention, the light shielding portion includes a first layer having a certain transmittance for an illuminating light and a second layer formed of chemical materials other than that of the first layer and having a transmittance which is substantially zero against the illuminating light, the first and second layers being laminated to each other in a predetermined overlapped area so that the transmittance of an edge portion of the light shielding portion differs from that of the central portion surrounded by the edge portion.

For making this photo mask, the first and second layers are deposited one by one with a predetermined film thickness onto a light transparent substrate, and after that, removing a certain area of the second layer, the central portion of the circuit pattern is formed, and then, removing a certain area of the first layer, the edge portion of the circuit pattern is formed.

In another embodiment of a shielding portion of the photo mask according to the present invention, a third layer is provided between the first and second layers, which is formed of a different chemical material from that of the first and second layers, and piling up the first, second and third layers one by one with a certain overlapped area, the transmittance of the light shielding portion for an illuminating light is made to be different between the edge portion and the central portion of the shielding portion.

For making this photo mask, the first, second and third layers are deposited one by one with a predetermined film thickness respectively onto a light transparent substrate, and after that, by removing a certain area of the second layer, the central portion of the circuit pattern is formed, and then, by removing a certain area of the first layer, the edge portion of the circuit pattern is formed.

In the above described manner, making different chemical characteristic (for example, etching resistance) of a plurality of layers that construct a circuit pattern, only an upper layer is removed by the etching process, and the film thickness of a lower layer remains as it was formed, and therefore the film thickness (transmittance) may not be changed during the etching process.

Further, according to the present invention, if a part of a plurality of layers that construct the light shielding portion is formed as a thin film of a phase shifter, it is possible to obtain an effect of the phase-shifting masks (edge enhancement type or shading effect enhancement type). Especially, if the intermediate layer is formed as a phase shifter, it is possible to conveniently control its film thickness during the film forming process. In this case, since the light intensity of the transmitted light passed through the phase shifter portion can be adjusted by a combination with another layer having a predetermined light transmittance, it is possible to enhance the contrast of a pattern image. Further, according to the present invention, as the area or line width of the phase shifter can be increased in order to obtain the equivalent effect to the conventional phase-shifting mask, it is advantageous to decrease the possibility for occurence of defects during the mask pattern process.

The above and other advantageous features of the present invention will be understood more clearly from the following description of the preferred embodiments thereof, taken in conjunction with the accompanying drawings which are adopted by way of example and not to limit the scope of the invention.

DETAILED DESCRIPTION

First Embodiment

Figure 1:
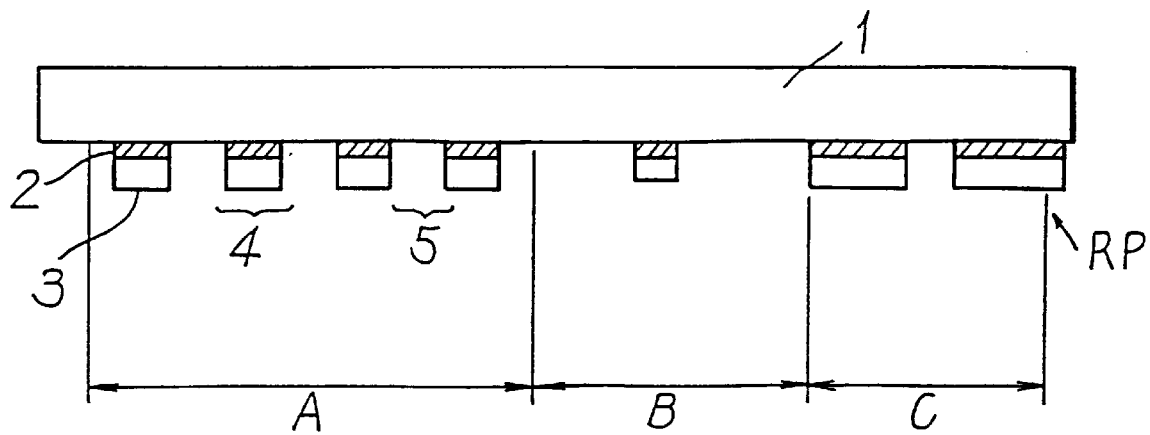
FIG. 1 is a schematic diagram showing the sectional construction of a photo mask according to the first embodiment of the present invention.

FIG. 1 is a schematic cross sectional view showing the construction of a photo mask according to the first embodiment of the present invention.

In the figure, a mask substrate 1 is substantially transparent for an illuminating light of a certain wavelength (i-line, KrF-eximer laser, X-rays, etc.), such as a glass substrate having the transparence of 90% or more. Here, it is preferable for the substrate 1 to be made of a material such as silica, which has few bubbles and deformations and which has a small thermal expansion coefficient.

Onto the backside of the substrate 1, a predetermined pattern is formed with half transparent portions 4 comprising two layers of a metal thin film 2 and a dielectric thin film 3, for example $SiO_2$, and transparent portions 5 of the exposed mask substrate 1. The metal thin film 2 is generally etched to form a circuit, and accordingly, it is preferable for the metal film 2 to select a material which is superior in etching characteristics and has great strength even if it is thin, such as chromium.

As for the pattern RP shown in FIG. 1, area A illustrates a so-called line and space pattern, area B is an isolated line pattern, and area C is an isolated space pattern.

Among these patterns, the line and space pattern is considered as an example to describe hereunder the principles for enhancing the contrast of a fine pattern in this embodiment.

The metal thin film 2 has a film thickness corresponding to the light transmittance of 1 to 15% for the illuminating light (exposure light). The exposure light passing through the metal thin film 2 is not only decreased in its quantity, but changed in its phase relative to the transmitted light passed through the transparent portions 5, owing to the difference of refractive indexes between the metal thin film 2 and environmental air. The amount of the phase difference is proportional to the film thickness of the metal thin film 2, and a predetermined phase change may be obtained by adjusting the film thickness.

In this embodiment, however, since the film thickness is controlled to obtain a certain amount of transmittance, it is actually difficult to obtain both desired transmittance and phase difference at one time, merely by means of adjusting the thickness of the metal thin film 2.

Therefore, according to the present invention, the metal thin film 2 and the dielectric thin film 3 are laminated to form the half-transparent portion 4, the transmittance of the half-transparent portion 4 is controlled by means of adjusting the thickness of the metal thin film 2, and the thickness of the dielectric thin film 3, thereby enabling to obtain a desired phase difference between the transmitted light from the transparent portion 5 and the transmitted light from the half-transparent portion 4. In this case, each film thickness of the metal thin film 2 and the dielectric thin film 3 is so adjusted as to have desired transmittance and phase difference taken in consideration with respective film thickness.

Figure 2A:
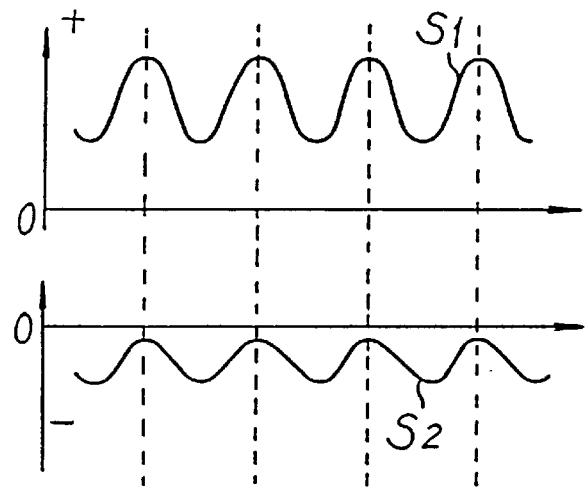
FIGS. 2a to 2c and FIGS. 3a to 3c are diagrams for explaining the principles of the first embodiment of the invention.
Figure 2B:
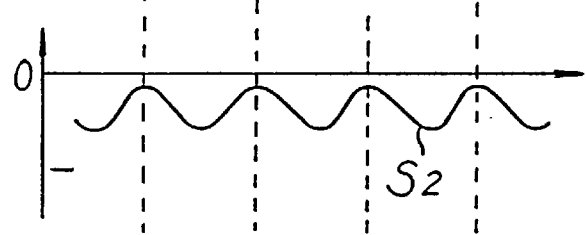
Figure 2C:
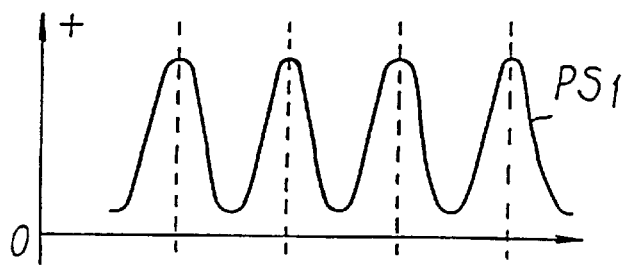

FIGS. 2a, 2b and 2c show images of an area A shown in FIG. 1 projected by a projection optical system, that is, amplitude distribution of the projected image of a line and space pattern which is as fine as the resolution limit of the optical system. In each figure, the abscissa denotes the position, and the ordinate denotes the amplitude of the light intensity.

FIG. 2a shows a projected image $S_1$ (amplitude distribution) of the transparent portion 5 or the space portions in the line and space pattern.

FIG. 2b shows a projected image $S_2$ (amplitude distribution) of the half-transparent portion 4 or the line portions in the line and space pattern, and here, each film thickness of the metal thin film 2 and the dielectric thin film 3 is determined in such a manner that the light passing through the half-transparent portions 4 has a phase difference of about $(2n+1)\pi$ radian (n is an integer) with reference to that of the light passing through the transparent portions 4. Therefore, when the projected image of the transparent portions 5 (refer to FIG. 2a) has the positive amplitude distribution $S_1$ which has the maximum value at the center of the each transparent portion 5 (indicated by broken lines), the projected image of the half-transparent portions 4 (refer to FIG. 2b) may have the negative amplitude distribution $S_2$ with the negative maximum value at the center of the each half-transparent portion 4 (intermediate portions between the broken lines).

Actually, as these two amplitude distributions $S_1$ and $S_2$ are observed with their amplitudes added to each other, the composite amplitude distribution $PS_1$ of the projected image may be obtained as shown in FIG. 2c. That is, the minimum points in the amplitude distribution $S_1$ of the transparent portions 5 conform to the negative maximum points in the amplitude distribution $S_2$ of the half-transparent portions 4, and accordingly, the minimum value is far more decreased when they are added to the latter. On the other hand, as the maximum points in the amplitude distribution $S_1$ of the transparent portions 5 conform to the negative minimum points in the amplitude distribution $S_2$ of the half-transparent portions 4, the maximum value will not be decreased much when they are added to the latter.

Therefore, in the distribution $PS_1$ of FIG. 2c generated by the projected image of the photo mask according to the present invention, the maximum value is not decreased much and the minimum value may be greatly decreased, compared with the amplitude distribution $S_1$ in FIG. 2a which corresponds to the conventional photo mask, and accordingly, the contrast of the projected image may be enhanced even if the circuit pattern is formed with a fine pitch equivalent to the resolution limit of the projection optical system.

Figure 3A:
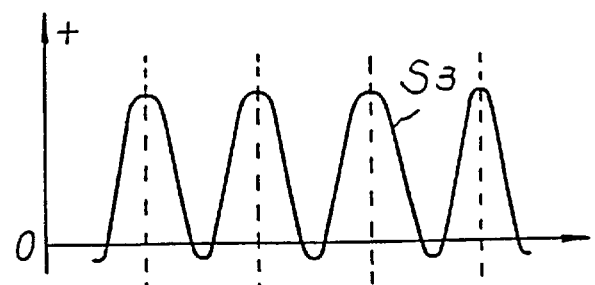
Figure 3B:
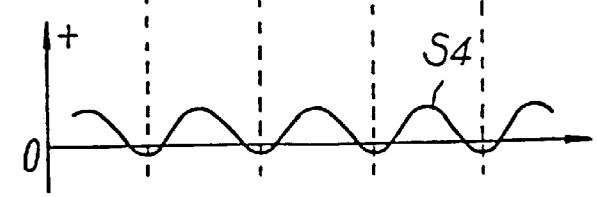
Figure 3C:
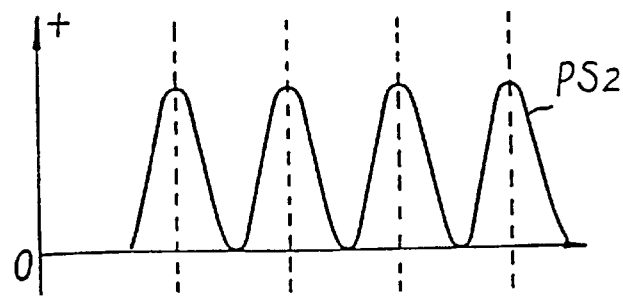

By the way, according to the present invention, the contrast may be enhanced not only for the fine pattern but a coarse pattern, now this will be described as follows:

FIGS. 3a, 3b and 3c show the amplitude distribution of a projected image of the line and space pattern similarly in the case of FIGS. 2a, 2b and 2c. However, the fineness of the pattern will be sufficiently coarse compared with the resolution limit of the projection optical system.

FIG. 3a shows the amplitude distribution $S_3$ of a projected image generated only from the transparent portions, and as it is generally known, the distribution shows the maximum values at the position corresponding to the transparent portion and the minimum values at the position corresponding to the intermediate portions therebetween, and the minimum values are negative. In the conventional photo mask comprising the transparent portions and the light shielding portions, the energy distribution becomes a squarewave of the amplitude values shown in FIG. 3a, and therefore, as the minimum values are negative, the subordinate maximum values (corresponding to the minimum values of the amplitude) is generated between each of the maximum values (corresponding to the maximum values of the amplitude) in the energy distribution.

On the contrary, in the photo mask comprising the transparent portions and the half-transparent portions according to the present embodiment, the subordinate maximum values may be removed, as will be described as follows.

FIG. 3b shows the amplitude distribution $S_4$ of the projected image only from the half-transparent portions. In this case, differing from the case of the fine pattern, the phase difference between a light beam passed through the transparent portion and a light beam passed through the half-transparent portion, is set to $2n\pi$ radian (n is an integer). Therefore, the amplitude distribution $S_4$ shows the maximum values at the position corresponding to the center of the half-transparent portion and the minimum value (negative) at the position corresponding to the center of the transparent portion.

If this photo mask is actually observed, the resultant amplitude distribution $PS_2$ becomes the sum of the amplitude distribution $S_3$ and the amplitude distribution $S_4$ as shown in FIG. 3c. The negative minimum value points in the amplitude distribution $S_3$ correspond to the positive maximum value points in the amplitude distribution $S_4$. Therefore, they cancelled by each other in the amplitude distribution $PS_2$ which is the sum of these distributions $S_3$ and $S_4$, and accordingly, the amplitude value at that position may be set to nearly zero. In this way, it is possible to remove the subordinate maximum values which have been occurring in the case of the conventional photomask having the transparent portions and the light shielding portions.

As described above, in the case of this embodiment, the transmittance is determined only by the thickness of the metal thin film. However, it is possible for the dielectric thin film to use a dielectric multilayer films having a high reflective index for an illuminating light thereby adjusting the transmittance of the half-transparent portions to the desired value in combination with the metal thin film. In this case, as the amount of the light absorption in the metal thin film is decreased, the metal thin film is not damaged even if the illuminating light of very high peak power is applied. Moreover, the above mentioned dielectric multilayer films can be formed with a plurality of dielectric thin films of high refractive index and of low refractive index, which are piled up to one another alternately so as to have several to tens of layers, and therefore, if the proper choice of layer construction is made, it is possoble to set the reflective index for the incident light arbitrary.

In the above described embodiment, the half-transparent portions 4 are formed of multilayer films comprising the metal thin film 2 and the dielectric thin film 3 as shown in FIG. 1. it is noted that, without using the metal thin film 2, if the dielectric thin film 3 is of a light-absorbing dielectric thin film, and the thickness and the light absorbance (namely type) of the dielectric film is optimized, it is possible to obtain an arbitrary transmittance and phase difference at a time even if the half-transparent portion is formed by a single-layer film. Here, the light absorbing dielectric thin film may be made of such organic materials as $SiO_2$ or PMMA mixed with dye.

Further, in the above embodiment, the half-transparent portions 4 are formed in such a manner that the metal thin film 2 is deposited onto the mask substrate 1, then the dielectric thin film 3 is laminated on the metal thin film 2. Conversely, it is possible to form the dielectric thin film 3 onto the substrate 1 at first, and then laminate the metal thin film 2 on the deposited dielectric film 3.

Second Embodiment

Figure 4:
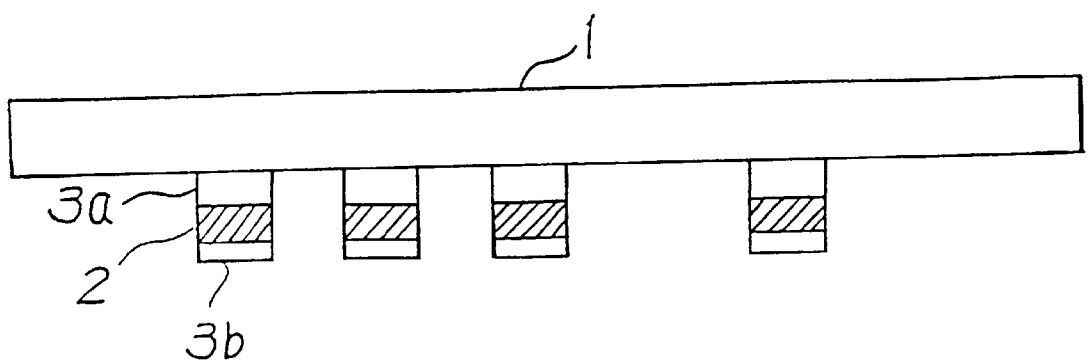
FIG. 4 is a schematic diagram showing the sectional construction of the second embodiment of the present invention.

FIG. 4 is a schematic cross sectional diagram showing the construction of a photo mask according to the second embodiment of the present invention. In this photo mask, at first a dielectric thin film 3a is formed on a surface of the mask substrate 1, secondly the metal thin film 2 is formed, and then a dielectric thin film 3b is formed. Consequently, the half-transparent portions are constructed with three-layer films. Here, as the dielectric thin film 3b is an antireflection film, this construction may efectively prevent the generation of ghosts or the like which are generated when the reflected light from an exposure object or the optical projection system is diffused by a surface of the metal thin film 2 and consequently undesired positions of a resist layer (corresponding to the half-transparent portions) are also exposed. The film thickness of the dielectric thin film 3b is directly determined on the basis of the wavelength of the exposure light, the refractive index of the metal thin film 2 and the refractive index of the dielectric thin film 3b itself.

Further, the thickness of the metal thin film 2 is determined so as to have a desired value in consideration with the thickness of the dielectric thin films 3a and 3b.

The thickness of the dielectric thin film 3a is so determined that the sum of the phase differences generated by the dielectric thin films 3a and 3b and the metal thin film 2 becomes π radian or 2π radian, for example.

Furthermore, as the dielectric thin film 3b shown in FIG. 4 is for preventing reflection, it can be removed when it is not needed to prevent reflection.

Figure 5A:
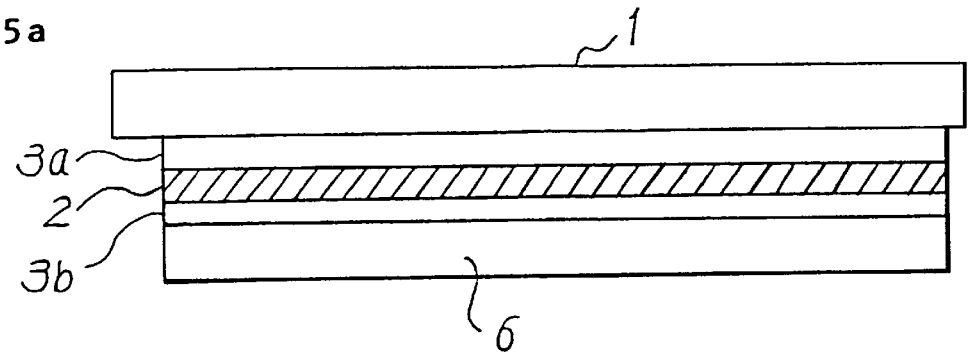
FIGS. 5a to 5c show examplaly processes of the method for making a photo mask according to the second embodiment of the invention.

Next, referring to FIGS. 5a, 5b and 5c, the process for making the photo mask of the second embodiment of the invention will be described as follows:

FIG. 5a shows the first step of the process in which the dielectric thin film 3a, the metal thin film 2 and the dielectric thin film 3b are laminated in this order onto a surface of the mask substrate 1 by means of spattering, evaporation, etc. so as to have uniform film thickness depending on desired transmittance and phase difference. And the surface of the last film is coated with a photoresist layer 6 uniformly. On this condition, the contact or proximity exposure of the master mask 6 is performed or a circuit pattern is formed by means of the direct-write lithografy using electron beams or light beams, and thus, the developed condition is as shown in FIG. 5b. Then, the dielectric thin films 3a, 3b and the metal thin film 2 are etched by using the remained photoresist 6 as a mask, and after etching is completed, the photoresist 6 is removed, thereby obtaining the photo mask of the present embodiment as as shown in FIG. 5c.

Accordingly, in the case of the process for making the photo mask of this embodiment, only a one time process is sufficient for making a circuit pattern on the photo mask, and in contrast with the case of the conventional phase-shifting mask, any other pattern forming processes and any alignment processes between respective patterns are not required.

Figure 5B:
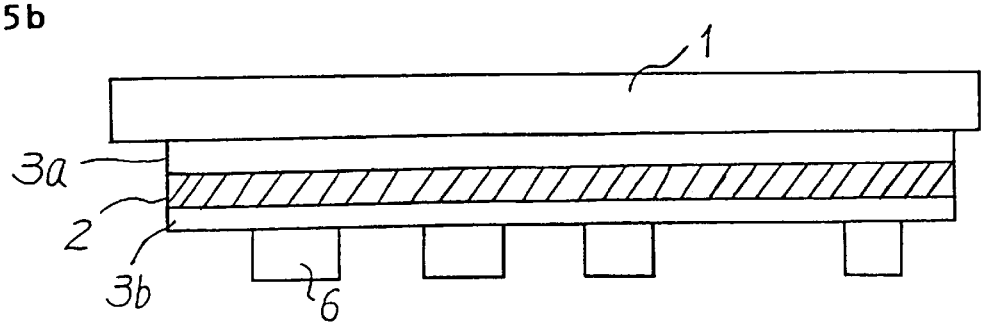
Figure 5C:
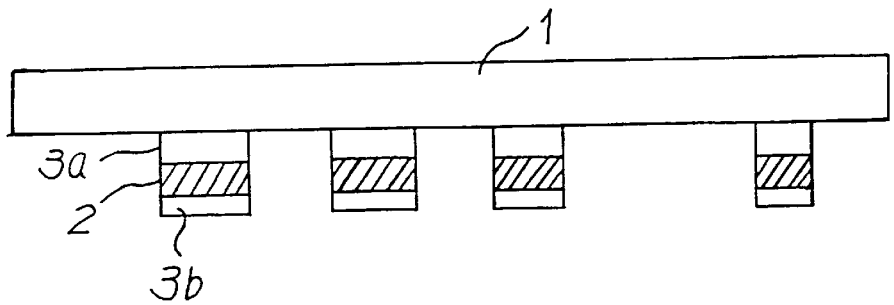

In the process shown in FIGS. 5a, 5b and 5c, the photo mask having two-layer dielectric thin films 3a and 3b has been described. Needless to say, a mask without the dielectric thin film 3b as the antireflection film may also be made by the same process.

If both materials of the dielectric thin film 3a and the mask substrate 1 are the same, for example both of them are made of $SiO_2$, it becomes very difficult to retain the mask substrate 1 perfectly and only remove the dielectric thin film 3a in the etching process. In such a case, another dielectric film, for example, a SiNx layer is laminated between the dielectric thin film 3a and the mask substrate 1, using it as an etching stopper, the dielectric thin film 3a of $SiO_2$ is etched, and then only the dielectric thin film of SiNx is etched. Consequently, the dielectric thin film 3a may be removed completely, without damageig the mask substrate 1 of $SiO_2$. At that time, the dielectric thin film 3a is made to have the thickness of SiNx, namely by the optical path difference due to the SiNx layer so that a transmitted light from the transparent portion has a phase difference of 2 nπ or (2 n+1)π radian (n is an integer) with reference to a transmitted lightfrom the half-transparent portion. Also, considering the film thickness of the SiNx layer, the film thickness of the metal thin film 2 is adjusted and accordingly, the transmittance of the half-transparent portion is controlled.

In addition to the antireflection film 3b deposited on the outside of the metal thin film 2 in the second embodiment, it is possible to form another antireflection film of high transmittance onto the other surface (upper surface in the figure) which is an incidence surface of the substrate 1 for the exposure light. In this case, it is prevented that a light reflected from an exit side of the exposure light is further reflected from the incidence surface of the substrate 1, and accordingly generation of an inconvenient stray light may be prevented.

In the second embodiment, the transmittance of the half transparent portion is about 1 to 15%. At the position in the pattern or in-the vicinity of the pattern, a transmitted light from the half transparent portion has an effect to enhance the contrast of an image, as is described above. However, as to the half-transparent portion of large area, the transmitted light therefrom is directed to an object to be exposed as a mere stray light. But, the amount of the stray light is about 1 to 15% of that of the primary light from the transparent portions, and accordingly it may be insignificant in the case of the recent high resolution resist.

In addition, the transmittance of the half-transparent portion may be so determined as not to decrease in the thickness of the resist layer during developing for the positive type resist, and not to remain a resist layer (concave portion) on the corresponding position to the half-transparent portion for the negative type resist, on the basis of the type of the photoresist and the optical characteristics of the projection optical system (aberrations etc.). Accordingly, the above described transmittance is not limited to the range of 1 to 15%, and, if the decrease of the thickness has not occured, the transmittance may be selected more than 15% on the particular condition for enhancing the contrast.

In the above described first and second embodiments, the half-transparent portionis are made of multilayer films comprising a metal thin film and a dielectric thin film, but, materials other than metal or dielectric film may also be used if they can control the transmittance of the half-transparent portion and phase difference of a transmitted light therethrough. Moreover, the half-transparent portion may also be formed as a single layer. Further, the present invention may be applied to a photo mask for an exposure apparatus comprising a X-ray illumination source. In this case, the mask substrate 1 may be a $SiO_2$ film, the metal thin film 2 may be formed by, for example, Au, Ta, W, WN, etc., and as to the dielectric thin film 3, $SiO_2$ or the like may be used.

Third Embodiment

Figure 6:
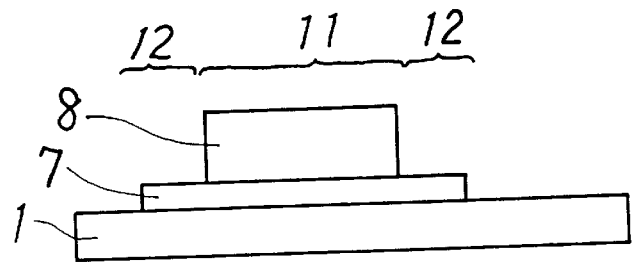
FIG. 6 shows a schematic sectional construction of the pattern portion of a photo mask according to the third embodiment of the present invention.

FIG. 6 shows a schematic sectional view illustrating a abridged lamination construction of a circuit pattern of a photo mask according to the third embodiment of the present invention. In this embodiment, the circuit pattern is constructed with layers of two or more materials different in chemical characteristics (for example, etching resistance, etc.). Deposited on the glass substrate (mask substrate) 1 are, for example, a chromium layer as a light passing layer 7 (first layer) that has a transparence or a certain transmittance for an illuminating light, and a tungsten silicide (WSi) layer as a light shielding layer 8 (second layer) that has almost 0% transmittance for the illuminating light. Since the light shielding layer 8 of the tungsten silicide is formed around central portion 11 of the chromium layer 7, it is possible to obtain a pattern which has a certain transmittance in the edge portion 12 and almost 0% transmittance in the central portion 11.

Figure 13A:
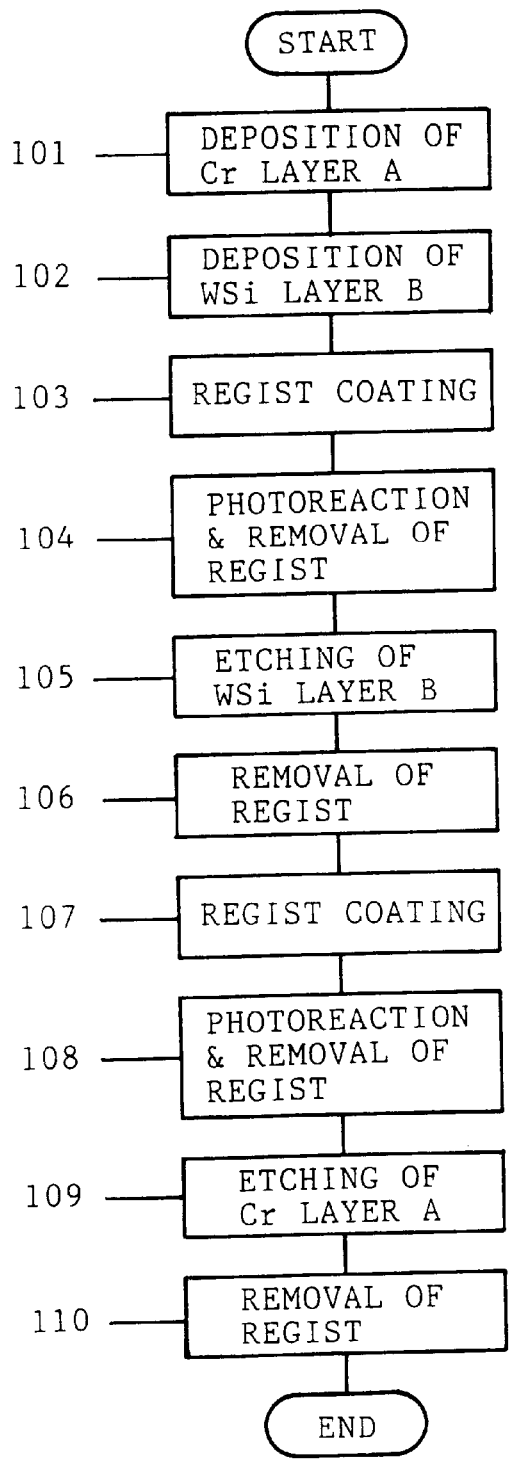
FIGS. 13a and 13b are flow charts showing a mask manufacturing process and modification thereof according to the third embodiment of the present invention.

A process for manufacturing the photo mask according to the third embodiment, is practiced based on a flow chart shown in FIG. 13a. In order to make the photo mask, at first the chromium layer 7 is deposited by means of spattering for the thickness presenting a predetermined transmittance (step 101), and then the tungsten silicide layer 8 is deposited on the chromium layer by the CVD (chemical vapor deposition) process for the thickness controlled to provide a almost 0% trensmittance of whole laminated layers depending on the transmittance (thickness) of the layer 7 (step 102). After that, the mask surface is covered with photoresist (positive resist) (step 103), and the resist in the portion other than the central portion 11 of the mask pattern is exposed and removed (step 104). Then, the tungsten silicide layer 8 is removed by means of sulfur hexafluoride ($SF_6$) gas, (step 105), and the remaining resist is removed (step 106). As a result, the central portion 11 of the pattern is formed. Further, the mask is coverd with a photoresist for the second time (step 107), and the resist outside of the edge portion of the pattern, is exposed and removed (step 108). After that, the etching process for the chromium layer 8 is performed by means of RIE (Reactive Ion Etching) with a mixed gas of carbon tetrachloride and oxygen (step 109), and finally, remaining resist is removed to form the edge portion 12 of the circuit pattern.

Figure 13B:
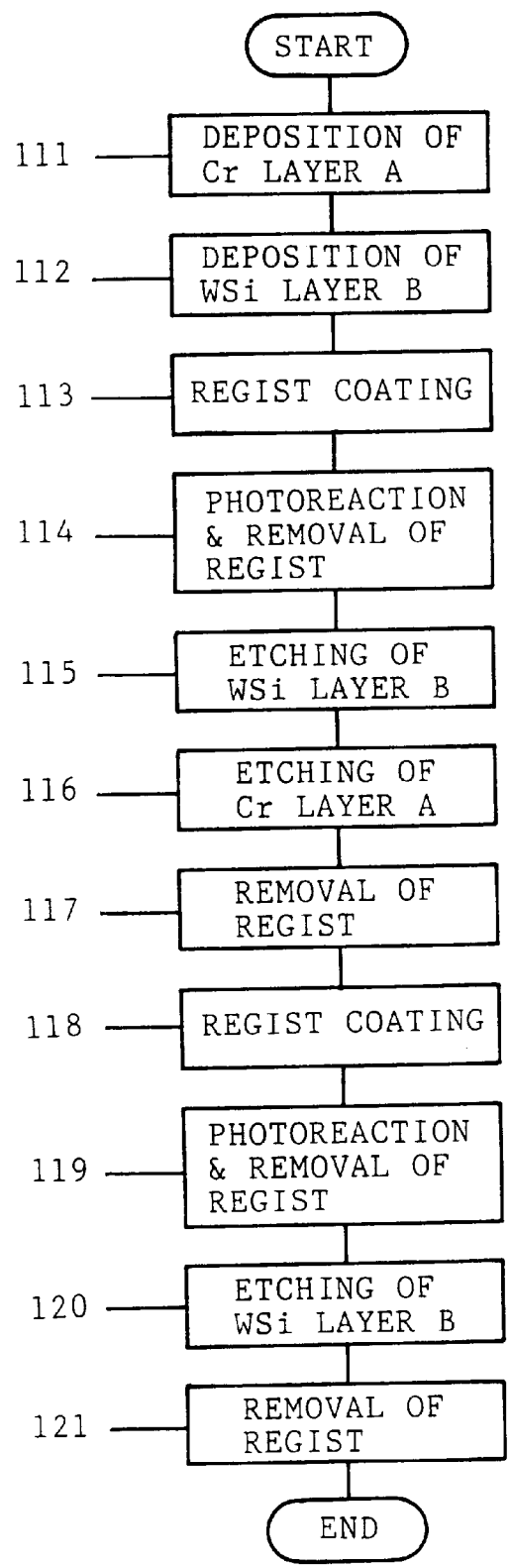

On the other hand, a process according to a flow chart shown in FIG. 13b may also be applied. In this case, firstly, the chromium layer 7 is deposited by means of sputtering for a certain thickness to obtain a predetermined transmittance (step 111), and then, the tungsten silicide layer 8 is deposited onto the chromium layer 7 by means of CVD for the thickness controlled to provide a almost 0% transmittance of the whole laminated layers 7 and 8, depending on the transmittance (film thickness) of the layer 7 (step 112). After that, the mask surface is coated with a photoresist (step 113), and the resist outside of the edge portion of the pattern is exposed and removed (step 114). Then, the tungsten silicide layer 8 is etched by means of $SF_6$ gas (step 115), and the chromium layer 7 is etched by means of the mixed gas of carbon tetrachloride and oxygen (step 116), so as to show a surface of the glass substrate 1. After that, the resist remaining in the preceding process is removed (step 117), then a photoresist is coated on the surface of the mask for the second time (step 118), and then the resist in the position other than the central portion 11 of the pattern is exposed and removed (step 119). Moreover, the tungsten silicide layer 8 is removed by means of etching (step 120), and finally, the remaining photoresist is removed.

In this embodiment, it is to be noted that the material forming the circuit pattern layer, etching gas, etchant, resist and their combination are not limited to the above, and preferably, the combination is so selected that the material of the transparent layer 7 should have higher etching resistance than the material of the light shielding layer 8.

Fourth Embodiment

Figure 7:
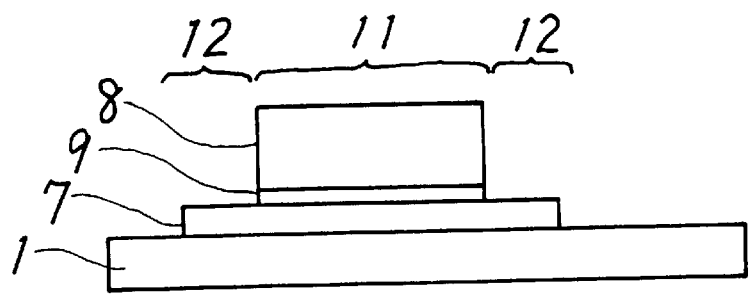
FIG. 7 shows a schematic sectional construction of the pattern portion of a photo mask according to the fourth embodiment of the present invention.

FIG. 7 shows a schematic sectional view illustrating an abridged lamination construction of a circuit pattern portion of a photo mask according to the fourth embodiment of the present invention. In this embodiment, between a transparent layer 7 and a light shielding layer 8 (first and second layers) that are made of a material having the same chemical characteristics (etching resistance, etc.), there is provided an intermediate layer 9 ( third layer) made of a material having different chemical characteristics from that of the layers 7 and 8. That is, the intermediate layer 9 is provided to prevent the transparent layer 7 from being etched and changed in its thickness when the light shielding layer 8 is etched, as the layers 7 and 8 (the first and second layers) sandwich the layer 9, have the same chemical characteristics. On the glass substrate 1, a transparent layer 7 is formed of a chromium thin film which is deposited so thin as to have a desired transmittance, and, the intermediate layer 9 is formed by a silicon dioxide ($SiO_2$) film which is deposited on the layer 7. Moreover, the light shielding layer 8 is formed by, for example the chromium film. In the similar way as the third embodiment, by forming the light shielding layer 8 of the chromium layer around the central portion 11 of the transparent layer 7 of the chromium layer, it is possible to obtain a pattern having a certain transmittance at the edge portion 12 and almost 0% transmittance at the central portion 11.

Figure 14A:
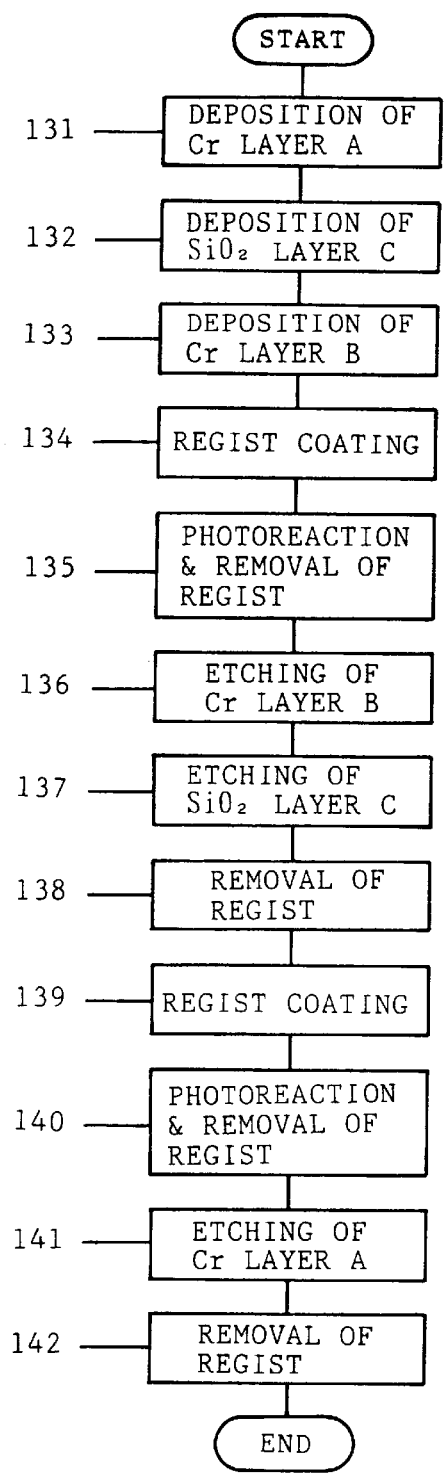
FIGS. 14a and 14b are flow charts showing a mask manufacturing process and modification thereof according to the fourth embodiment of the present invention.

The process for making the photo mask according to the fourth embodiment, is performed based on a flow chart shown in FIG. 14a. In order to form the photo mask, firstly, a chromium layer 7, a silicon dioxide layer 9 and a chromium layer 8 are deposited in this order on the glass substrate 1 to a predetermined thickness for each (step 131 to 133). Then, the mask is coated with a photoresist (step 134), and the resist in the portion other than the central portion 11 of a pattern is exposed and removed (step 135). After that, the chromium layer 8 and the silicon dioxide layer 9 are removed in this order by means of etching (steps 136 and 137), and the remaining resist is removed (step 138). As a result, the central portion 11 of the pattern is formed. Then, a photo-resist is coated for the second time (step 139), and the resist outside of the edge portion of the pattern is exposed and removed (step 140). After that, the chromium layer 7 is removed by means of etching (step 141), and finally, the remaining resist is removed (step 142) to form the edge portion 12 of the circuit pattern.

Figure 14B:
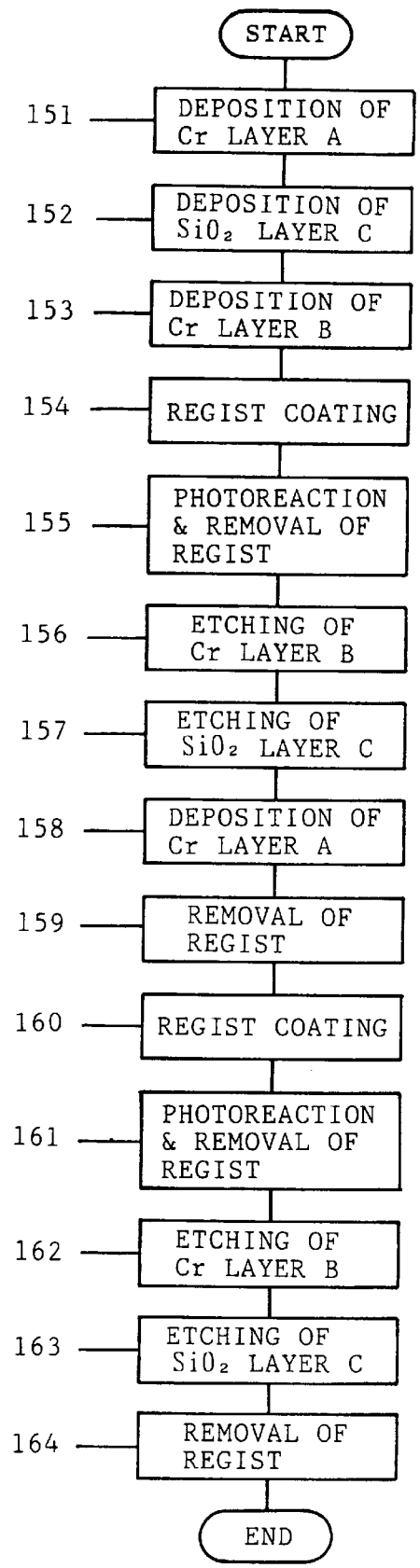
Figure 15:
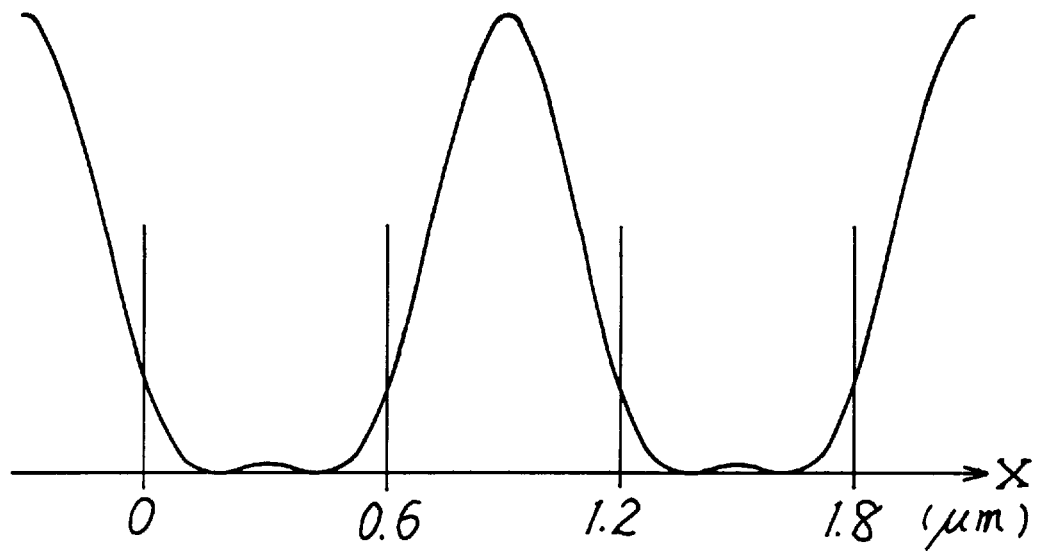
FIG. 15 is a diagram showing a detected light intensity distribution of the projected pattern image when the illumination is applied to the circuit pattern of a conventional photo mask.

On the other hand, a modified process may also be performed according to a flow chart shown in FIG. 14b. In this case, a chromium layer 7, a silicon dioxide layer 9 and a chromium layer 8 are deposited on a glass substrate 1 in this order to a predetermined thickness for each (step 151 to 153). Then, the mask is coated with a photoresist (step 154), and the resist outside of the edge portion of the pattern is exposed and removed (step 155). Then, each layer of 7 to 9 is removed in this order by means of etching (step 156 to 158) so as to show a surface of the glass substrate 1. After that, the resist remaining in the preceding process is removed (step 159), then a photoresist is coated on the mask for the second time (step 160), and the resist in the portion corresponding to the central portion 11 of the pattern is exposed and removed (step 161). Moreover, each of the chromium layer 8 and the silicon dioxide layer 9 is removed by means of etching (steps 162 and 163), and finally, the remaining resist is removed.

Figure 8:
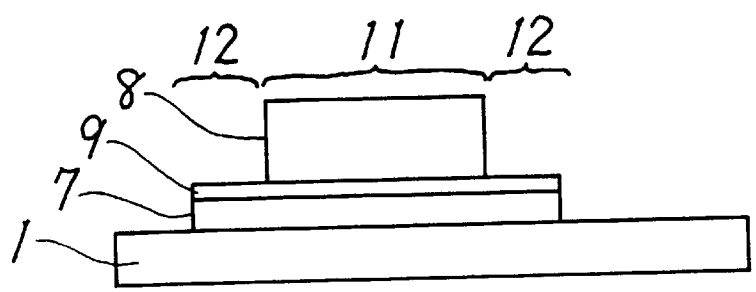
FIG. 8 shows a schematic sectional construction of the pattern portion of a photo mask in which the intermediate layer is retained, according to the fourth embodiment of the invention.
Figure 9:
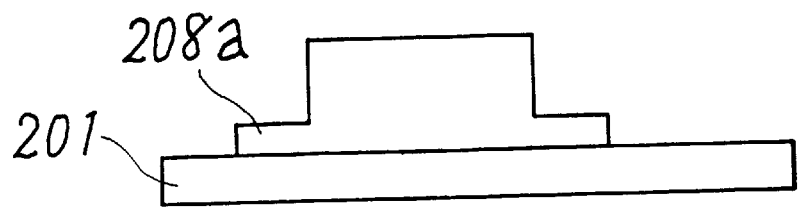
FIG. 9 is a schematic cross sectional view showing the pattern portion of a conventional photo mask in which the film thickness is partially different.

In the above described fourth embodiment, a portion in the intermediate layer 9, which corresponds to the pattern edge portion 12, is removed by means of etching, but, this portion is not particuraly needed to remove, and thus, as shown in FIG. 8, it may be left to construct a transparent layer having a certain transmittance or transparence along with the transparent layer 7. Moreover, if the remaining portion of the intermediate layer 9 is formed with a phase shifter, it may also be used as a phase-shifting mask (especially, of edge enhancement type or shading effect enhancement type).

In the above embodiment, the transparent layer 7 and the light shielding layer 8 are both made of a material having the same chemical characteristics, but, it is often required to form the intermediate layer even if materials of different chemical characteristics are used. For example, when the tungsten silicide and chromium layers are combined in reverse condition to that of the third embodiment, it is necessary to form the intermediate layer between the transparent layer of the tungsten silicide and the light shielding layer of the chromium. This is because the corrosion resistance of tungsten silicide against the etching material (mixed gas with carbon tetrachloride and oxygen) is relatively smaller than that of chromium. That is, when the upper layer of chromium is etched, the lower layer of tungsten silicide is also etched. In order to prevent this, an intermediate layer may be provided as in the case of the fourth embodiment even if the materials of layers forming a pattern have different chemical characteristics. In this case, it is advantagious to arbitrary deterlmine each material for the transparent and shielding layers 7, 8 and etching materials.

In the photo masks shown in FIGS. 6 and 7, the film thickness of the transparent layer 7 may not be changed from the original one, even if the shielding layer 8 or the intermediate layer 9 is etched, and the film thickness or the transmittance of the layer 7 may be controlled during the film forming.

In each of the above embodiments, the transparent layer (first layer) and the light shielding layer (second layer) are in the form of a single-layer construction respectively, but each layer may also be in the form of a lamination including a plurality of layers. In this case, for example, if the transparent layer is constructed with a plurality of layers, it is possible to alter the number of layers in the edge portions of the pattern so as to change the transmittance thereof. Otherwise, if the number of layers in the edge portion of the pattern is partially altered, it is possible to change the transmittance depending on the position within the edge. Especially in the third embodiment (FIG. 6), if at least one layer amoung the layers which construct the transparent layer is made of a phase shifting layer, it is possible to use the mask as a phase-shifting mask similar to the fourth embodiment. In this case, the phase-shifting layer may be inserted into any position such as a contact portion between the transparent layer and the glass substrate of the mask or a portion between the layers forming the transparent layer. Moreover, not only the transparent layer but also the light shielding layer may be constructed in the form of plural layers.

In the case where a surface layer of the light shielding layer of the plural layer construction or a layer contacting with the glass substrate in the transparent layer of the plural layer construction is made of an antireflection material such as chromium oxide, it may be used as a so-called antireflection film to decrease undesired reflected light at the pattern. However, if the surface layer of the light shielding layer is formed as the antireflection film, the antireflection layer may also be removed at a portion corresponding to the pattern edge while the corresponding edge portion of the light shielding layer is etched. Therefore, in the fourth embodiment, not only the surface layer of the light shielding layer but also the intermediate layer (third layer) 9 is made of an antireflection film, and accordingly, the antireflection film is advantageously formed all over the pattern surface. It is to be noted that the intermediate layer 9 should be formed with the material which is transparent and has different chemical characteristics for the etching materials from that of the chromium, and for example, it may be formed of a silicon dioxide layer deposited with the thickness to such extent that the antireflection effect is obtained.

Next, reffering to FIGS. 10 and 12, the experimental result of a projection test will be described hereunder. In the test, the conventional photo mask and the photo mask according to the present invention are illuminated respectively, and the light intensity of each transmitted light is detected.

Figure 10:
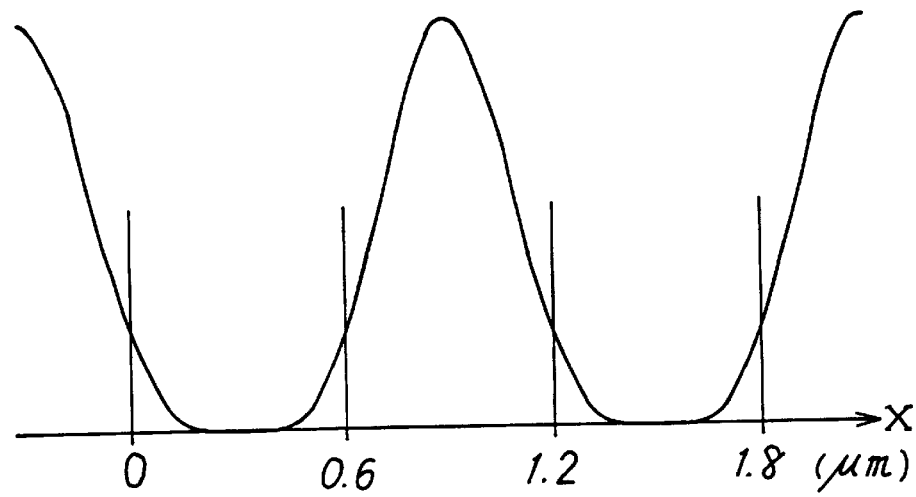
FIG. 10 is a diagram showing a detected light intensity distribution of the projected pattern image when the illumination is applied to the circuit pattern of a photo mask according to an embodiment of the invention.

FIG. 10 shows a detected light intensity distribution of the projected pattern image when the illumination is allpied to the circuit pattern of a photo mask according to the embodiment of the present invention. In this case, the transmittance of the edge portion is determined to be 1.0%. FIG. 12 shows a detected light intensity distribution of the projected pattern image when the illumination is applied to the circuit pattern of a conventional photo mask. That is, both figures show the case of the photo mask in which the transmittance of the pattern portion is 0%. In the figures, the abscissa denotes a position along the pattern pitch and the ordinate denotes an amplitude of the light intensity. In each of the masks, the width of the pattern protion is 0.6 $\mu$m, and the duty ratio of the line-and-space pattern is 1:1. In the figures, the areas of $0 \leq X \leq 0.6$ and $1.2 \leq X \leq 1.8 [\mu m]$ correspond to the pattern portions of the photo mask. In this test, an exposure apparatus is used, in which the projection lens has the numerical aperture NA=0.6, coherence factor $\sigma$=0.3 and exposure wavelength $\lambda$=365 nm.

As seen from these figures, in the case of the photo mask according to the present invention (1% transmittance at the pattern edge), it is apparent that the light intensity on the pattern portion of the image becomes almost zero in contrast to the case where the conventional photo mask (transmittance of the pattern portion is zero) is used. In addition, if the portion contributing to form an image ( the edge portion of the pattern) is designed to have a desired transmittance, it may be deduced from the calculations that the contrast of the image is enhanced.

Figure 19A:
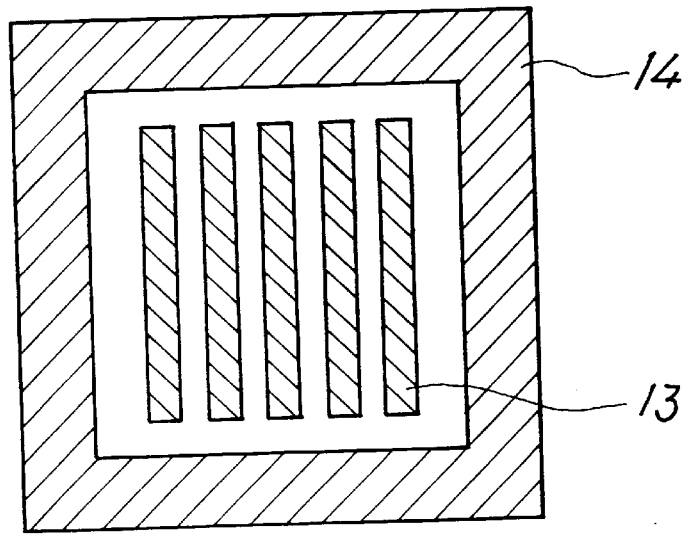
FIG. 19a shows a schematic view of a constructional example of a photo mask having a shading band.
Figure 19B:
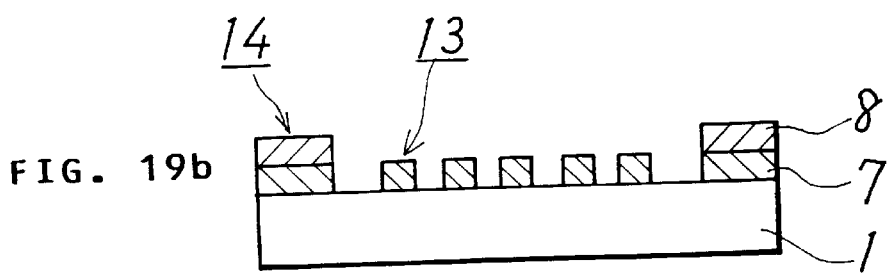
FIG. 19b shows a schematic sectional construction of a shading band and a circuit pattern of a photo mask according to an embodiment of the present invention

Generally, the photo mask formed with a circuit pattern has a shading band 14 (wider than the circuit pattern) around the area of the pattern 13 as shown in FIG. 19a. If the circuit pattern 13 is formed only with a layer (transparent layer) having a predetermined transmittance, the shading band 14 may also be formed with the layer having the transmittance. As a result, a light beam depending to the transmittance reaches to the projected image on the wafer at a portion corresponding to the shading band, thereby inconveniently exposing the resist to the light beam. For preventing this, it is desirable to select the transmittance of the shading band to zero. Therefore, as shown in FIG. 19b, the circuit pattern 13 and the shading band 14 of the photo mask are to be constructed by a light shielding layer having the transmittance of approximately zero and a transparent layer having a predetermined transmittance. That is, the circuit pattern is formed on the glass substrate 1 with the transparent layer (first layer) 7 having the transmittance of approximately 1%, and the portion corresponding to the shading band is further formed with the light shielding layer (second layer) 8. Such a process for making the photo mask is similar to that of the previously described process. That is, at first the transparent layer 7 and the light shielding layer 8 are formed with the thickness enabling to have a predetermined transmittance respectively, and then, the light shielding layer 8, except a portion corresponding to the shading band 14, is removed by etching. After that, as for the transparent layer 7, except a portion corresponding to the circuit pattern 13, the other portion is removed in the similar manner.

Moreover, in comparison with the third and fourth embodiments, the shading band 14 corresponds to the central portion 11 of the pattern, and the circuit pattern 13 corresponds to the edge portion 12. Furthermore, the circuit pattern 13 is not limited to be made only of the transparent layer 7, and, as the aforementioned embodiments, the pattern may have the central portion formed with the light shielding layer 8.

Fifth Embodiment

Figure 16:
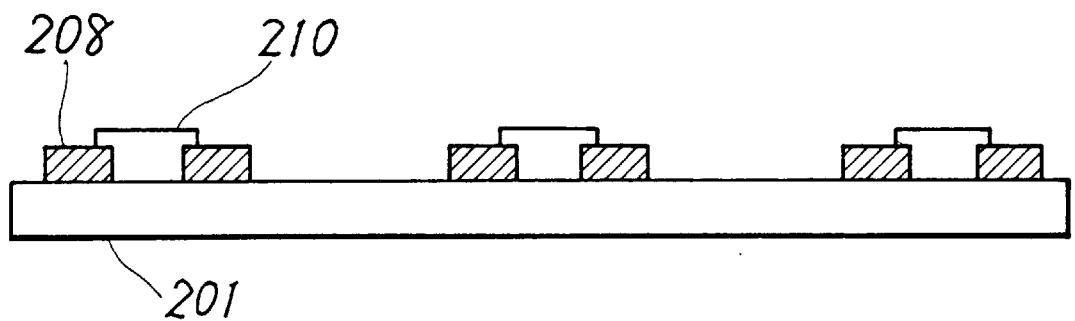
FIG. 16 is a cross sectional view showing a schematic sectional construction of the pattern portion of a conventional phase-shifting mask.

Next, referring to FIG. 11, the fifth embodiment of the present invention will be described hereunder. In this embodiment, the construction of the light shielding portion of a photo mask according to the embodiment shown in FIG. 8 is applied to a phase-shifting mask. In this connection, as shown in FIG. 16, in the case of the conventional phase-shifting mask of the edge enhancement type or shading effect enhancement type, a light shielding layer 208 which has a transmittance of approxmately zero is formed on a glass substrate 201. The layer 208 has for example an opening of 0.5 μm width, and a layer 210 of the phase shifter is mounted to the opening.

Figure 11:
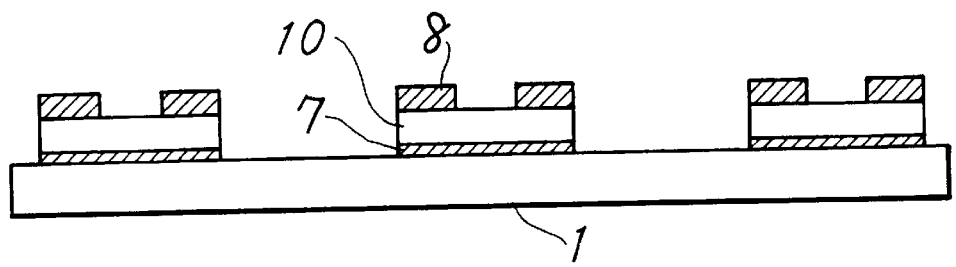
FIG. 11 shows a schematic sectional construction of the pattern portion of a phase-shifting mask according to the fifth embodiment of the invention.
Figure 17:
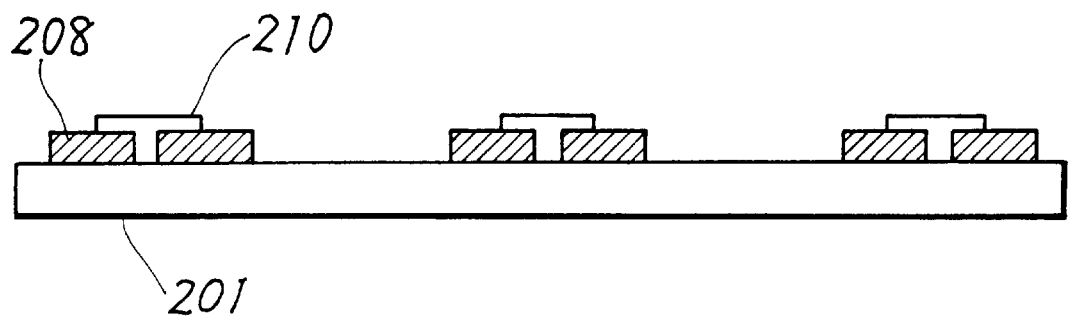
FIG. 17 is a cross sectional view showing a schematic sectional construction of the circuit pattern portion of a conventional phase-shifting mask which is adapted to have the equivalent grade of the image as that of the phase-shifting mask of an embodiment of the present invention.

FIG. 11 is a schematic cross sectional view illustrating an abridged construction of the pattern portion of a phase-shifting mask according to the fifth embodiment of the present invention. This corresponds to the modified one of the fourth embodiment in which, after the etching for the chromium layer 9, the eching process for the phase-shifting intermediate layer 9 is not performed. This phase-shifting mask is of edge enhancement type or shading effect enhancement type, and comprises a transparent layer 7 having a predetermined transmittance (in this case, 40%) and a phase-shifting intermediate layer 10 deposited on a substlate 1 in this order, and further, on the intermediate layer, a light shielding layer 8 of 0% transmittance having an opening of 0.5 μm width. It is apparent by comparing FIGS. 11, 16 and 17 that the inventive embodiment of FIG. 11 has a larger area of the phase-shifter (layer 10), and therefore it is advantageous for manufacturing.

Now, refferring to FIGS. 12 and 18, the experimental result of an projection test will be described hereunder. In the test, the conventional photo mask and the photo mask having a circuit pattern of the sectional construction as shown in FIG. 11 are illuminated respectively, and the light intensity distribution of the pattern image formed by the transmitted light from the mask is detected. As previously described, the exposure apparatus is used, in which the projection lens has the numerical aperture NA=0.6, the coherent factor σ=0.3 and exposure wavelength λ=365 nm.

Figure 12:
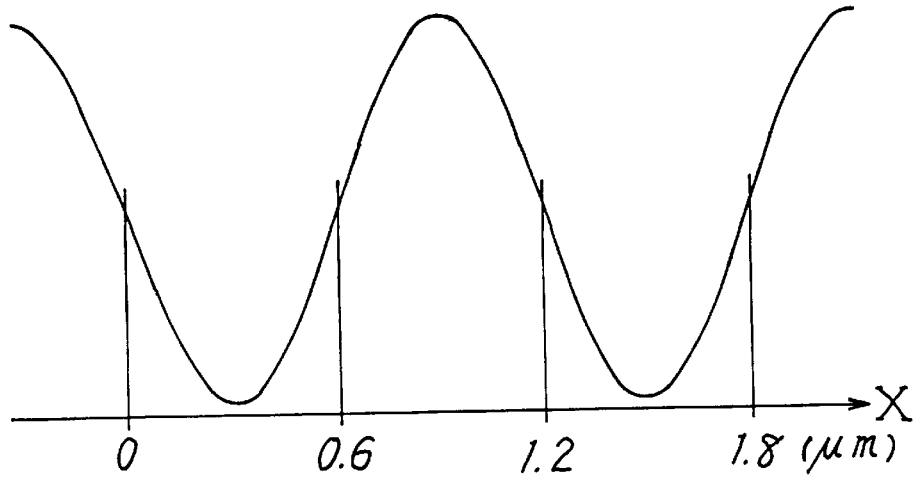
FIG. 12 is a diagram showing a light intensity distribution of the projected pattern image formed by the transmitted light passed through the circuit pattern when the illumination is applied to a phase-shifting mask according to an embodiment of the invention.

FIG. 12 is a diagram showing a light intensity distribution of the projected pattern image formed by the transmitted light from the circuit pattern when the illumination is applied to the phase-shifting mask (edge enhancement type or shading effect enhancement type) according to the embodiment of the present invention. In the figure, the abscissa denotes a position along the pattern pitch, and the ordinate denotes an amplitude of the light intensity. In this mask, the light transmittance of the phase shifter portion (substrate 1+transparent layer 7+phase-shifting layer 10) is about 40% in contrast to that of the phase shifter (substrate 201+phase-shifting element 210) of the conventional phase-shifting mask as shown in FIG. 16.

Figure 18:
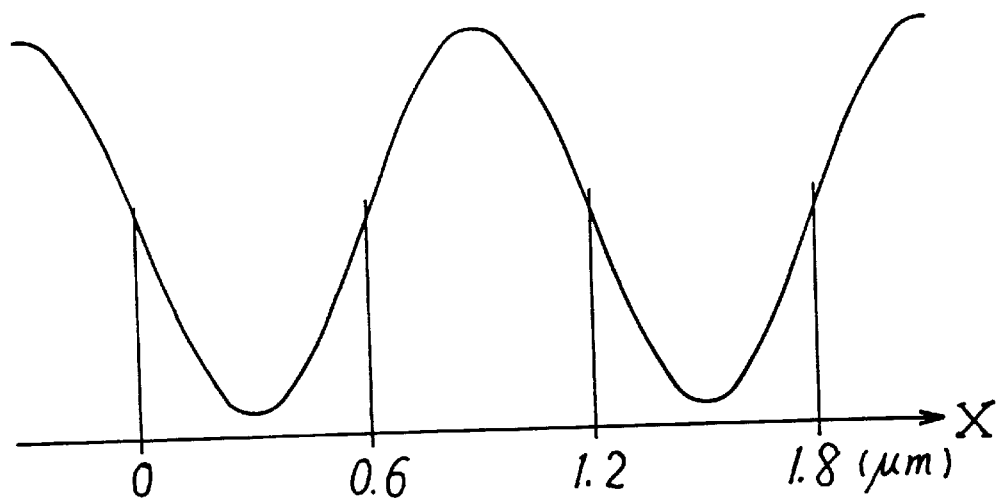
FIG. 18 is a diagram showing a detected light intensity distribution of the projected pattern image when the illumination is applied to the circuit pattern of a conventional phase-shifting mask.

FIG. 18 is a diagram showing a light intensity distribution of the projected pattern image formed by the transmitted light from the circuit pattern when the illumination is applied to the conventional phase-shifting mask (edge enhancement type or shading effect enhancement type). In FIG. 18, the abscissa denotes a position along the pattern pitch, and the ordinate denotes an amplitude of the light intensity. In this conventional mask, the transmittance of the phase shifter portion is about 100%.

As shown in FIGS. 12 and 18, in comparison with the conventional mask, the contrast of the image is enhanced from 0.898 to 0.938 with the photo mask according to the present invention. Incidentally, when the phase-shifting element is not applied, the contrast becomes 0.826. From the above results, it is also apparent that the contrast of a projected image can be enhanced by the present invention.

What is claimed is:

1. A photo mask for copying a predetermined pattern on a photosensitive substrate by an exposure beam, comprising:

a geometrically plane transparent portion which transmits the exposure beam; and a geometrically plane exposure beam reducing portion which has a multi-layer structure having at least a first layer and a second layer, said first layer giving a phase difference between the exposure beam passed through the transparent portion and the exposure beam passed through said exposure beam reduction portion, and said first layer and said second layer reducing the exposure beam, wherein a peripheral edge portion of said exposure beam reducing portion has a different transmittivity to the exposure beam from a center portion thereof, the center portion being enclosed by said peripheral edge portion.

2. A photo mask according to claim 1, wherein said first layer has a predetermined transmittivity to the exposure beam and said second layer is formed from a material with a first plurality of chemical properties that are different from a second plurality of chemical properties of said first layer, said second layer having a transmittivity of almost 0% to the exposure beam; and said first and second layers overlap each other in a predetermined area, wherein the predetermined area of overlap makes a transmittivity of said peripheral edge portion higher than a transmittivity of said center portion.

3. A photo mask according to claim 1, wherein said exposure beam reducing portion comprises:

a third layer formed from a material that has a plurality of chemical properties that are respectively different from a first and a second plurality of chemical properties of said second and first layers, and said third layer being positioned between said first and second layers, wherein each of said first, second and third layers overlap each other in a predetermined area such that the predetermined area of overlap makes a transmittivity of said peripheral edge portion higher than a transmittivity of said center portion.

4. A photo mask according to claim 1, wherein said multi-layer structure includes an anti-reflection layer.

5. A photo mask according to claim 1, wherein said first layer and said second layer are constructed from metallic materials.

6. A photo mask according to claim 5, wherein said metallic materials contain chrome.

7. A photo mask according to claim 5, wherein said first layer and said second layer are constructed from different metallic materials.

8. A photo mask according to claim 7, wherein either said first layer and said second layer contain chrome.

9. A substrate on which a pattern has been formed utilizing the photo mask of claim 1.

10. A photo mask for copying a predetermined pattern on a photosensitive substrate by an exposure beam, comprising:
    a first portion having a transmittivity to the exposure beam; and
    an exposure beam reducing portion which reduces the exposure beam,
    wherein at least a part of said exposure beam reducing portion has a muti-layer structure which includes an anti-reflection layer which decreases reflection of an undesired beam from said photosensitive substrate side and a surrounding edge portion surrounding said exposure beam reducing portion and a center portion surrounded by said surrounding edge portion, said center portion having a different tramsmittivity to the exposure beam than the surrounding edge portion.

11. A substrate on which a pattern has been formed utilizing the photo mask of claim 10.

12. A substrate having a pattern formed thereon by exposure to an exposure beam using a photo mask, said photo mask comprising:
    a geometrically plane transparent portion which transmits the exposure beam; and
    a geometrically plane exposure beam reducing portion which has a multi-layer structure having at least a first layer and a second layer, said first layer giving a phase difference between the exposure beam passed through the transparent portion and the exposure beam passed through said exposure beam reduction portion, said second layer reducing the exposure beam,
    said second layer being superimposed over a selected area about the center of said first layer so as to form a peripheral edge portion in the first layer of said exposure beam reducing portion enclosing said selected area with the transmittivity of said first and second layer being different from the transmittivity of said transparent portion.

13. A substrate having a pattern formed thereon by exposure to an exposure beam using a photo mask, said photo mask comprising:
    a transparent first portion layer having a transmittivity to the exposure beam; and
    an exposure beam reducing portion for attenuating the exposure beam,
    wherein at least a part of said exposure beam reducing portion has a multi-layer structure which includes an anti-reflection layer to decrease reflection of an undesired beam, a surrounding edge portion surrounding said exposure beam reducing portion and a center portion surrounded by said surrounding edge portion, said center portion having a different transmittivity to the exposure beam than the surrounding edge portions and to the transmittivity of the transparent first portion.

14. A photo mask for copying a predetermined pattern onto a substrate by an exposure beam, comprising:
    a transparent portion having a transmittivity to said exposure beam;
    a phase conversion portion which converts a phase of said exposure beam;
    a beam shielding portion which can shield said exposure beam,
    wherein a part of said beam shielding portion contains an anti-reflection member which decreases reflection of an undesired beam fromm said substrate side.

15. A photo mask as set forth in claim 14, wherein said anti-reflection member is made of chrome oxide.

16. A photo mask as set forth in claim 14, wherein said anti-reflection member is formed on the surface of said shielding portion.

17. A substrate on which a pattern has been formed utilizing the photo mask of claim 14, comprising:
    a transparent portion having a transmittivity to transmit said exposure beam substantially without attenuation; and
    a beam shielding portion which can shield said exposure beam,
    wherein a part of said beam shielding portion contains an anti-reflection member which decreases reflection of an undesired beam.

18. A photo mask for copying a predetermined pattern onto a substrate by an exposure beam, comprising:
    said predetermined pattern having
        a semi-transparent portion having a predetermined transmittivity to said exposure beam; and
        a transparent portion superimposed on said semi-transparent portion so as to form substantially the same area as said semi-transparent portion, said transparent portion having a higher transmittivity with respect to said exposure beam than said semi-transparent portion,
    wherein said transparent portion and said semi-transparent portion are formed such that the exposure beam which passes through said semi-transparent portion and the exposure beam which passes through said transparent portion have a phase contrast of $2n\pi$ or $(2n+1)\pi$ radian (n+integer).

19. A photo mask as set forth in claim 18, wherein said transparent portion has a transmittivity of 90% or more with respect to said exposure beam; and
    said semi-transparent portion has a transmittivity of 1–15% with respect to said exposure beam.

20. A photo mask as set forth in claim 18, wherein
    said semi-transparent portion is formed by layers of two different materials; and
    said transmittivity and said phase contrast to said exposure beam is defined based on the thickness of each of said layers.

21. A photo mask as set forth in claim 18, wherein said semi-transparent portion is formed by layers of a metallic thin film and a dielectric thin film.

22. A photo mask as set forth in claim 18, wherein
    said semi-transparent portion is formed with a light absorption dielectric thin layer; and
    said transmittivity and said phase contrast to said exposure beam is defined based on the material and film thickness of said dielectric thin layer.

23. A photo mask for copying a predetermined pattern onto a substrate by an exposure beam, comprising:

said predetermined pattern having
- a transparent portion which transmits said exposure beam substantially without attenuation; and
- a semi-transparent portion superimposed on said transparent portion so as to from substantially the same area as said transparent portion, said semi-transparent portion having a lower transmittivity with respect to said exposure beam than said transparent portion, wherein said transparent portion and said semi-transparent portion are formed such that the exposure beam which passes through said semi-transparent portion and the exposure beam which passes through said transparent portion have a relative phase contrast of 2 n$\pi$ or (2 n+1), radian (n+integer).

24. A photo mask as set forth in claim 23, wherein
said transparent portion has a transmittivity of 90% or more with respect to said exposure beam; and
said semi-transparent portion has a transmittivity of 1–15% with respect to said exposure beam.

25. A photo mask set forth in claim 23, wherein
said semi-transparent portion is formed by layers of two different material; and
said transmittivity and said phase contrast to an exposure beam is defined based on the thickness of each of said layers.

26. A photo mask as set forth in claim 23, wherein said semi-transparent portion is formed by layers of a metallic thin film and dielectric thin film.

27. A photo mask as set forth in claim 23, wherein
said semi-transparent portion is formed with a light absorption dielectric thin film; and
said transmittivity and said phase contrast to said illumination light is defined based on the material and film thickness of said dielectric thin film.

28. A photo mask for transferring a pattern on a photosensitive substrate by an exposure beam, comprising:
- a transparent portion which transmits said exposure beam; and
- an attenuation portion having a transmittivity of 1–15% to said exposure beam, wherein said pattern includes at least one of said transparent portion and said attenuation portion in an alternately configured line and space pattern, and said attenuation portion is arranged as an isolated pattern within said transparent portion.

29. A mask according to claim 28, wherein said attenuation portion has a multi-layer structure.

30. A mask according to claim 28, wherein said attenuation portion has an anti-reflection layer which decreases reflection of an undesired beam.

31. A mask according to claim 28, further comprising a phase conversion portion which converts a phase of said exposure beam.

32. A mask for transferring a pattern onto a substrate by an exposure beam, comprising:
- a transparent portion to transmit the exposure beam substantially without attenuation;
- a reducing portion to reduce said exposure beam and convert a phase of said exposure beam; and
- a shielding portion having a transmittivity of almost 0% to said exposure beam.

33. A mask according to claim 32, wherein said shielding portion is formed on said reducing portion.

* * * * *

UNITED STATES PATENT AND TRADEMARK OFFICE
CERTIFICATE OF CORRECTION

PATENT NO.: 6,132,908
DATED : October 17, 2000
INVENTOR(S): Naomasa Shiraishi, et al.

It is certified that error appears in the above-identified patent and that said Letters Patent is hereby corrected as shown below:

Column 18, line 14, (claim 14), change "fromm" to --from--.

Signed and Sealed this

Eighth Day of May, 2001

Attest:

NICHOLAS P. GODICI

*Attesting Officer*       *Acting Director of the United States Patent and Trademark Office*